United States Patent [19]

Kimura

[11] Patent Number: 5,521,542

[45] Date of Patent: May 28, 1996

[54] LOGARITHMIC AMPLIFIER CIRCUIT USING TRIPLE-TAIL CELLS

[75] Inventor: Katsuji Kimura, Tokyo, Japan

[73] Assignee: NEC Corporation, Tokyo, Japan

[21] Appl. No.: 526,212

[22] Filed: Sep. 11, 1995

[30] Foreign Application Priority Data

Sep. 9, 1994 [JP] Japan .................................. 6-216432

[51] Int. Cl.$^6$ .............................. G06F 7/556; G06G 7/24; H03G 11/08
[52] U.S. Cl. .......................................... 327/352; 327/351
[58] Field of Search .................................. 327/350, 351, 327/352, 354, 52, 63

[56] References Cited

U.S. PATENT DOCUMENTS

| 4,990,803 | 2/1991 | Gilbert | 327/351 |
| 5,319,264 | 6/1994 | Kimura | 327/352 |
| 5,467,046 | 11/1995 | Kimura | 327/351 |

FOREIGN PATENT DOCUMENTS

| 62-100010 | 5/1987 | Japan . |
| 2-141012 | 5/1990 | Japan . |
| 3-127504 | 5/1991 | Japan . |
| 3-228412 | 10/1991 | Japan . |
| 4-165805 | 6/1992 | Japan . |
| 6-22304 | 3/1994 | Japan . |
| 6-56940 | 7/1994 | Japan . |

OTHER PUBLICATIONS

IEEE Transactions on Circuit and Systems, Fundamental Theory and Applications, vol. 39, No. 9, Sep., 1992, pp. 771–777.
IEE of Japan, Mar. 10, 1994, with English abstract.

Primary Examiner—Toan Tran
Attorney, Agent, or Firm—Sughrue, Mion, Zinn, Macpeak & Seas

[57] ABSTRACT

A logarithmic amplifier circuit is provided, which contains a differential amplifier, a first rectifier for rectifying an initial input signal and for generating a first rectified output signal, a second rectifier for rectifying an amplified output signal from the differential amplifier and for generating a second rectified output signal, and an adder for adding the first and second rectified output signals to produce an output signal having a logarithmic characteristic. The first and second rectifiers each is made of a triple-tail cell. The cell contains first, second and third emitter- or source-coupled transistors and a constant current source for driving the transistors. An input signal is applied across bases or gates of the first and second transistors, and a dc voltage is applied to a base or gate of the third transistor. An output current is outputted through the coupled collectors or drains of the first and second transistors or through the collector or drain of the third transistor. The number of necessary current sources can be reduced. The logarithmic transfer characteristics can be adjusted by changing the dc voltage as required.

16 Claims, 9 Drawing Sheets

LOGARITHMIC AMPLIFIER CIRCUIT USING TRIPLE-TAIL CELLS

BACKGROUND OF THE INVENTION

1. Field of the Invention

The present invention relates to a logarithmic amplifier circuit and more particularly, to a logarithmic amplifier circuit using bipolar or MOS triple-tail cells. The triple-tail cell contains three bipolar transistors or MOSFETs whose emitters or sources are coupled together and is driven by a tail current.

2. Description of the Prior Art

The logarithmic amplifier circuit is popularly used to logarithmically compress the dynamic range of an input signal for measurement of the received signal strength in radio equipments such as a telemter.

A first conventional logarithmic amplifier circuit is shown in the Japanese Non-Examined-Patent Publication No. 3-127504 published in May 1991, which contains cascaded unit circuits at a plurality of stages. Each of the unit circuits has (a) a first amplifier having a limiting characteristic, i.e., limiter, (b) a second amplifier having no limiting characteristic and a unity gain, i.e., buffer, and (c) a combining circuit for combining the output signals of the first and second amplifiers. Each of the unit circuits further contains (d) an attenuator provided between the output of the first amplifier and the input of the second amplifier. The attenuator attenuates in amplitude the output signal from the corresponding first amplifier so that the attenuated signal causes no saturation in the combining circuit.

With the first conventional logarithmic amplifier circuit disclosed in the Japanese Non-Examined-Patent Publication No. 3-127504, the polygonal line approximation is used to obtain the logarithmic transfer characteristics. Specifically, since the initial input signal is successively amplified in the cascaded first amplifiers or limiters, the earliest output signal saturation occurs in the first amplifier at the last stage, and the subsequent output signal saturations successively occur in the remaining first amplifiers toward the first stage.

Therefore, the number of the stages of the unit circuits is required to be sufficiently large in order to restrict the approximation error to the true logarithmic transfer characteristics in rectification. This means that no logarithmic amplifier circuit having excellent accuracy can be obtained unless the circuit scale is sufficiently large.

A second conventional logarithmic amplifier circuit is shown in the Japanese Non-Examined-Patent Publication No. 2-141012 published in May 1990, which contains a voltage adder amplifier having input ends. The input ends provide different gains to corresponding applied signals. Switching diodes are connected to the input ends, respectively. An input signal is selectively applied to one of the input ends through a corresponding one of the diodes according to the voltage level of the input signal.

With the second conventional logarithmic amplifier circuit disclosed in the Japanese Non-Examined-Patent Publication No. 2-141012, since the polygonal line approximation is used to obtain the logarithmic transfer characteristics, the same problem as that of the circuit of the Publication No. 3-127504 occurs.

A third conventional logarithmic amplifier circuit is shown in the Japanese Non-Examined-Patent Publication No. 62-100010 published in May 1987. This circuit contains (a) cascaded RF amplifiers, (b) detector or rectifier circuits connected to the corresponding amplifiers and detecting the output signals from the corresponding amplifiers, (c) video limiter circuits connected to the corresponding detector circuits and limiting the amplitudes of the output signals from the corresponding detectors, (d) an adder circuit adding the detected output currents from the detectors, and (e) a common-base bipolar transistor the emitter of which is applied with the output current from the adder.

With the third conventional logarithmic amplifier circuit disclosed in the Japanese Non-Examined-Patent Publication No. 62-100010, since the detector or rectifier circuits each having the similar characteristics to the logarithmic ones are used, an error caused by the polygonal line approximation can be reduced. However, it is difficult to arbitrarily adjust the basic logarithmic transfer characteristics such as logarithmic accuracy, slopes of transfer curves and a dynamic range.

A fourth conventional logarithmic amplifier circuit, which was invented by the inventor, Kimura, is shown in the Japanese Examined-Patent Publication No. 3-228412 published in October 1991. This circuit contains (a) cascaded differential amplifiers at n stages where n>1, (b) a first rectifier connected to the input end of the amplifier at the first stage, (c) n second rectifiers connected to the output ends of the amplifiers at the second to n-th stages, and (d) an adder for adding the output signals from the first rectifier and from all the second rectifiers.

Each of the rectifiers has an unbalanced emitter-coupled differential pair of bipolar transistors and an unbalanced source-coupled differential pair of metal-oxide-semiconductor field-effect transistors (MOSFETs). The bipolar and MOS differential pairs have an output end pair, and the output currents outputted from the output end pair are subtracted by a subtracter. The adder adds the outputs from all the subtracters.

With the fourth conventional logarithmic amplifier circuit disclosed in the Japanese Examined-Patent Publication No. 3-228412, similar to that of the Japanese Non-Examined-Patent Publication No. 62-100010, an error caused by the polygonal line approximation can be reduced. However, it is difficult to arbitrarily adjust the basic logarithmic transfer characteristics because each of the rectifiers employs the unbalanced differential pairs.

Especially, since the unbalanced differential pairs are used, it is impossible to change the logarithmic characteristics after the logarithmic amplifier circuit is realized on a semiconductor integrated circuit device.

Also, the differential pairs each requires a driving current source. The differential pairs have large parasitic capacitances due to the connection states of the collectors or drains at output ends of the triple-tail cell. Accordingly, a necessary driving current tends to become large in order to expand the frequency characteristic of the logarithmic amplifier circuit, which results in the difficulty of power consumption reduction.

A fifth conventional logarithmic amplifier circuit, which was invented by the inventor, Kimura, is shown in the Japanese Examined-Patent Publication No. 6-22304 published in March 1994. This publication is equivalent to the Japanese Non-Examined-Patent Publication No. 62-293807 published in December 1987, and corresponds to the U.S. Pat. No. 4,794,342 patented on Dec. 27, 1988.

This circuit is an intermediate-frequency (IF) logarithmic amplifier circuit containing (a) n cascaded differential IF amplifiers where n>1, (b) a first differential pair applied with an initial input voltage and provided at a first stage, (c) n second differential pairs applied with corresponding output voltages from the n differential IF amplifiers and provided at second to n-th stages, and (d) an adder for adding the output voltages from the first differential pairs and from all the second differential pairs.

The first differential pair has two unbalanced emitter-coupled pairs of bipolar transistors. Each of the second differential pairs also has two unbalanced emitter-coupled pairs of bipolar transistors.

With the fifth conventional logarithmic amplifier circuit disclosed in the Japanese Examined-Patent Publication No. 6-22304, the same problem as that in the fourth conventional circuit occurs.

A sixth example of conventional logarithmic amplifier circuits, which was invented by the inventor, Kimura, is shown in the Japanese Examined-Patent Publication No. 6-56940 published in July 1994. This publication is equivalent to the Japanese Non-Examined-Patent Publication No. 62-292010 published in December 1987.

This circuit contains (a) n cascaded MOS differential amplifiers where n>1, (b) a first MOS differential pair applied with an initial input voltage and provided at a first stage, (c) n second MOS differential pairs applied with corresponding output voltages from the n differential amplifiers and provided at second to n-th stages, and (d) an adder for adding the output voltages from the first differential pairs and from all the second differential pairs.

The first differential pair has two unbalanced source-coupled pairs of MOSFETs. Each of the second differential pairs also has two unbalanced source-coupled pairs of MOSFETs.

With the sixth conventional logarithmic amplifier circuit disclosed in the Japanese Examined-Patent Publication No. 6-56940, the same problem as that in the fourth conventional circuit occurs.

A seventh example of conventional logarithmic amplifier circuit, which was invented by the inventor, Kimura, is shown in the Japanese Non-Examined Patent Publication No. 4-165805 published in June 1992. This publication corresponds to the U.S. Pat. No. 5,319,264 patented on Jun. 7, 1994.

This circuit contains (a) n cascaded differential amplifiers where n>1, (b) a first full-wave rectifier for producing an output current having a square-law characteristic and provided at a first stage, (c) n second full-wave rectifiers for producing output currents each having a square-law characteristic and provided at second to n-th stages, and (d) an adder for adding the output currents from the first rectifier and from all the second rectifiers.

The first rectifier has two unbalanced source-coupled pairs of MOSFETs. Each of the second rectifiers also has two unbalanced source-coupled pairs of MOSFETs.

With the seventh conventional logarithmic amplifier circuit disclosed in the Japanese Non-Examined Patent Publication No. 4-165805, the same problems as that of the Japanese Non-Examined-Patent Publication No. 62-100010 occurs.

Additionally, bipolar and MOS pseudologarithmic rectifiers applicable to the logarithmic amplifier circuit is disclosed in IEEE TRANSACTIONS ON CIRCUIT AND SYSTEMS, FUNDAMENTAL THEORY AND APPLICATIONS, Vol. 39, No. 9, September 1992, which was written by the inventor, Kimura. Each of the rectifiers contains two unbalanced, emitter or source-coupled differential pairs of bipolar transistors or MOSFETs.

SUMMARY OF THE INVENTION

Accordingly, an object of the present invention is to provide a logarithmic amplifier circuit that enables to reduce the number of necessary current sources.

Another object of the present invention is to provide a logarithmic amplifier circuit that enables to reduce the power consumption.

Still another object of the present invention is to provide a logarithmic amplifier circuit in which the logarithmic characteristics can be adjusted as required.

Further object of the present invention is to provide a logarithmic amplifier circuit that can reduce the number of necessary stages of differential amplifiers to simplify the circuit configuration.

A logarithmic amplifier circuit according to the present invention contains a differential amplifier producing an amplified output signal in response to an initial input signal; a first rectifier for rectifying the initial input signal and for generating a first rectified output signal; a second rectifier for rectifying the amplified output signal from the differential amplifier and for generating a second rectified output signal; and an adder for adding the first and second rectified output signals to produce an output signal having a logarithmic characteristic as an output of the logarithmic amplifier circuit.

The first rectifier includes first, second and third bipolar transistors or MOSFETs whose emitters or sources are coupled together and a first current source connected to said coupled emitters or sources of the first, second and third bipolar transistors or MOSFETs. The first, second and third bipolar transistors or MOSFETs are driven by a first tail current produced by the first current source. The initial input signal is applied across bases or gates of the first and second bipolar transistors or MOSFETs that form a first differential pair, and a first dc voltage is applied to a base or gate of the third bipolar transistor or MOSFET.

The first and second bipolar transistors or MOSFETs have collectors or drains coupled together and a first output current is outputted through the coupled collectors or drains. A second output current is outputted through a collector or drain of the third bipolar transistor or MOSFET.

One of the first output current, the second output current and a differential current of the first and second output currents is used as the first rectified output signal.

Similar to the first rectifier, the second rectifier includes fourth, fifth and sixth bipolar transistors or MOSFETs whose emitters or sources are coupled together and a second current source connected to the coupled emitters or sources of the third, fourth and fifth bipolar transistors or MOSFETs. The fourth, fifth and sixth bipolar transistors or MOSFETs are driven by a second tail current produced by the second current source. The output signal from the differential amplifier is applied across bases or gates of the fourth and fifth bipolar transistors or MOSFETs that form a second differential pair, and a second dc voltage is applied to a base or gate of the lo sixth bipolar transistor or MOSFET.

The fourth and fifth bipolar transistors or MOSFETs have collectors or drains coupled together and a third output current is outputted through the coupled collectors or drains. A fourth output current is outputted through a collector or drain of the sixth bipolar transistor or MOSFET.

One of the third output current, the fourth output current and a differential current of the third and fourth output currents is used as the second rectified output signal.

With the logarithmic amplifier circuit according to the present invention, since the first and second rectifiers are composed of the bipolar or MOS triple-tail cells each having a single current source, respectively, the number of necessary current sources can be reduced.

Also, the first and second differential pairs each composed of the two balanced bipolar transistors or MOSFETs and the collectors or drains are coupled together to form the output ends of the corresponding triple-tail cell. Therefore, the parasitic capacitances at the output ends of the cell decrease. Accordingly, the driving current consumption becomes lower at the same frequency of the initial input signal, which results in power consumption reduction.

Further, the input-output characteristics of the triple-tail cells vary by changing the values of the first and second dc voltages applied to the bases of gates of the third and sixth bipolar transistors or MOSFETs, and as a result, the logarithmic characteristics can be adjusted as required.

In the case or bipolar transistors, preferably, the first and second transistors have emitter areas equal to each other and the third transistor has an emitter area different from those of the first and second transistors. Similarly, the fourth and fifth transistors have emitter areas equal to each other and the sixth transistor has an emitter area different from those of the fourth and fifth transistors.

The first, second and third transistors may have emitter areas equal to each other, and the fourth, fifth and sixth transistors may have emitter areas equal to each other.

Preferably, at least one resistor or diode is connected to the emitter of each of the first to sixth transistors. This provides an advantage that the input dynamic range of each triple-tail cell is extended.

In the case of MOSFETs, preferably, the first and second MOSFETs have ratios (W/L) equal to each other and the third transistor has a ratio (W/L) different from those of the first and second MOSFETs. Similarly, the fourth and fifth MOSFETs have ratios (W/L) equal to each other and the sixth MOSFET has a ratio (W/L) different from those of the fourth and fifth MOSFETS.

The first, second and third MOSFETs may have ratios (W/L) equal to each other, and the fourth, fifth and sixth MOSFETs may have ratios (W/L) equal to each other.

In a preferred embodiment, the first rectifier is composed of a plurality of the triple-tail cells and the second rectifier is composed of a plurality of the triple-tail cells. At least one of the triple-tail cells of the first rectifier has an operating input voltage range different from the remainder of the triple-tail cells thereof. At least one of the triple-tail cells of the second rectifier has an operating input voltage range different from the remainder of the triple-tail cells thereof.

In this embodiment, at least one of the triple-tail cells of the first rectifier has an operating input voltage range different from the remainder thereof. Therefore, the first rectifier has an expanded input dynamic range. Similarly, since at least one of the triple-tail cells of the second rectifier has an operating input voltage range different from the remainder thereof, the second rectifier also has an expanded input dynamic range. Consequently, the logarithmic amplifier circuit having a wider dynamic range can be realized by a less number of the differential amplifiers, which simplifies its circuit configuration.

DETAILED DESCRIPTION OF THE PREFERRED EMBODIMENTS

Figure 1:
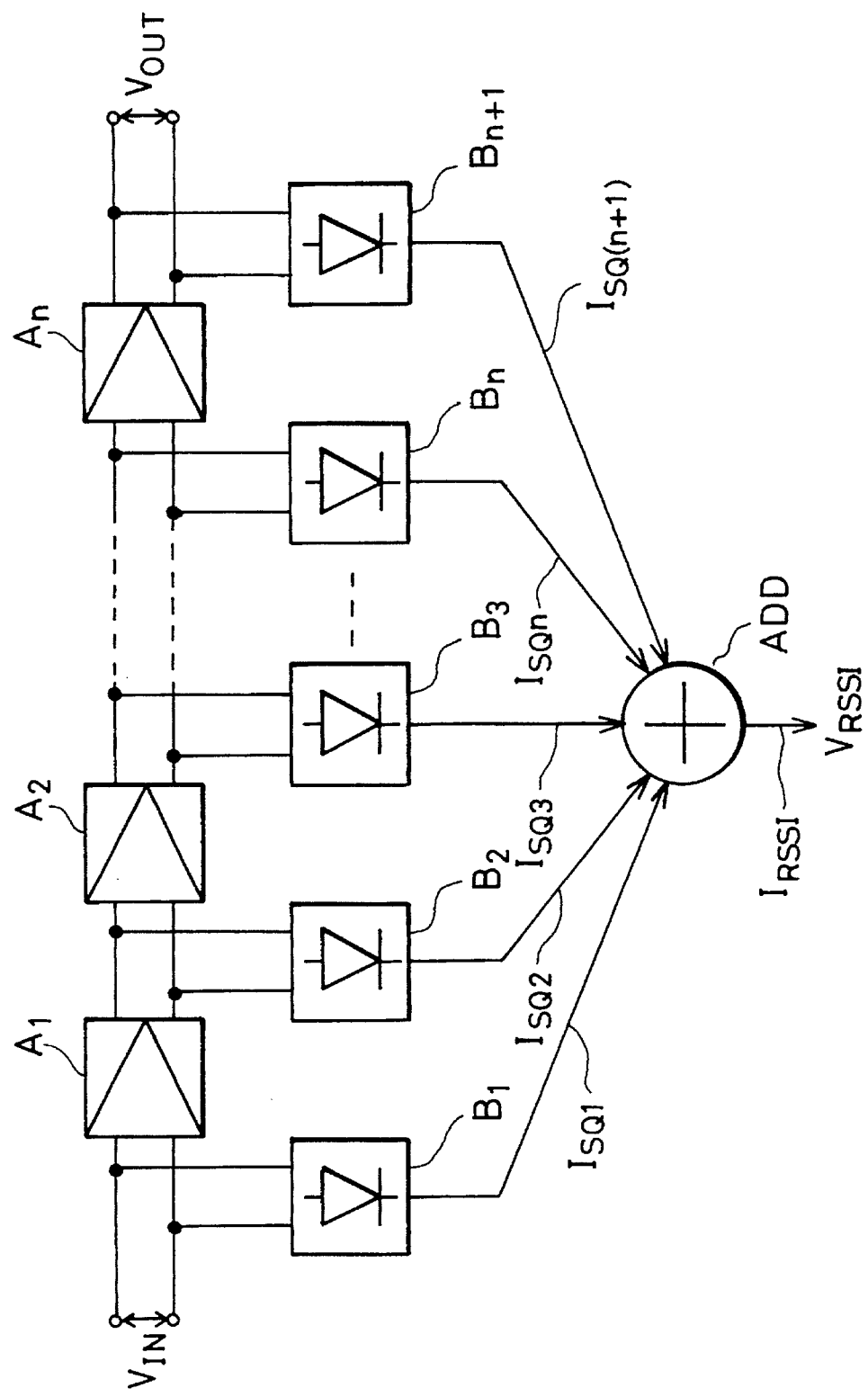
FIG. 1 is a schematic block diagram of a logarithmic amplifier circuit according to first to sixth embodiments of the present invention.

Preferred embodiments of the present invention will be described below while referring to the drawings attached.

FIRST EMBODIMENT

A logarithmic amplifier circuit according to a first embodiment has a configuration as shown in FIG. 1. This circuit includes n differential amplifiers $A_1$ to $A_n$ cascaded at n stages, (n+1) full-wave rectifiers $B_1$ to $B_{n+1}$, and an adder ADD, where n is a natural number.

The differential amplifier $A_1$ at the first stage is connected to the input ends of the logarithmic amplifier. The amplifier $A_1$ is applied with an initial input voltage $V_{IN}$ and outputs its amplified output voltage to the amplifier $A_2$ at the second stage. Similarly, the amplifiers $A_2$ to $A_{n-1}$ at the second to (n−1)-th stages are applied with the amplified output voltages from the amplifiers $A_1$ to $A_{n-2}$ at the first to (n−2)-th stages, and they output their amplified output voltages to the next amplifiers $A_3$ to $A_n$, respectively. The amplifier $A_n$ at the last or n-th stage is applied with the amplified output voltage from the amplifier $A_{n-1}$ and outputs am amplified output voltage $V_{OUT}$.

The rectifier $B_1$ is connected with the input ends of the logarithmic amplifier and is applied with the initial input voltage $V_{IN}$, outputting a rectified output current $I_{SQ1}$. The rectifiers $B_2$ to $B_{n+1}$ are connected with the output ends of the corresponding amplifiers $A_1$ to $A_n$, and they are applied with the corresponding, amplified output voltages, outputting rectified output currents $I_{SQ2}$ to $I_{SQ(n+1)}$, respectively. The output currents $I_{SQ1}$ to $I_{SQ(n+1)}$ each has an approximate or true square-law characteristic.

The adder ADD is applied with the rectified output currents $I_{SQ1}$ to $I_{SQ(n+1)}$ from the rectifiers $B_1$ to $B_{n+1}$ and add them to each other, producing an output voltage $V_{RSSI}$ and an output current $I_{RSSI}$ each having a logarithmic characteristic.

Figure 2:
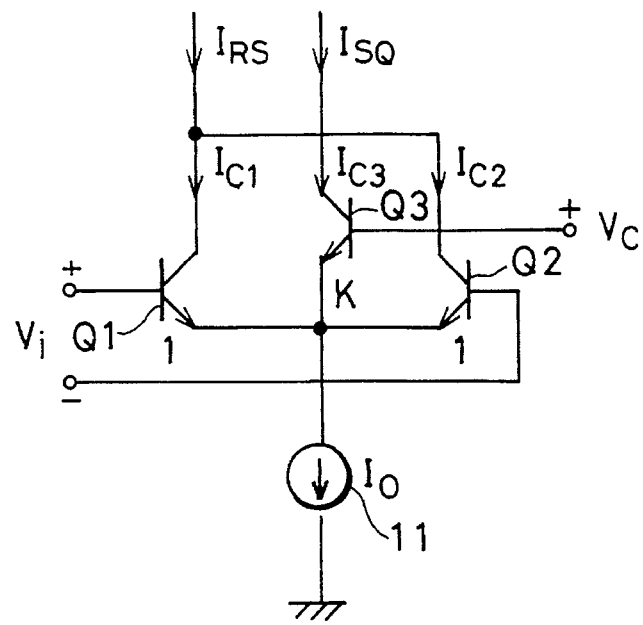
FIG. 2 is a circuit diagram of a full-wave rectifier according to the first embodiment, which is used for the logarithmic amplifier circuit of FIG. 1 and is made of a bipolar triple-tail cell.

The full-wave rectifiers $B_1$ to $B_{n+1}$ each has a circuit configuration as shown in FIG. 2, which is a triple-tail cell.

In FIG. 2, the full-wave rectifier or triple-tail cell contains a differential pair of emitter-coupled npn bipolar transistors Q1 and Q2, an npn bipolar transistor Q3, and a constant current source 11 generating a tail current $I_0$. The transistors Q1, Q2 and Q3 are driven by the tail current $I_0$.

An emitter of the transistor Q3 is connected with the coupled emitters of the transistors Q1 and Q2. An end of the current source 11 is connected to the coupled emitters of the transistors Q1, Q2 and Q3, and the other end thereof is grounded. Collectors of the transistors Q1 and Q2 are coupled together to form an output end of the cell and a collector of the transistor Q3 forms the other output end thereof.

The transistors Q1 and Q2 forming the differential pair have emitter areas equal to each other. The transistor Q3 has an emitter area K times as large as those of the transistors Q1 and Q2, where K>0. The constant K may be unity (1), and it may be greater or less than unity.

A differential input voltage $V_i$ is applied across input ends of the differential pair, i.e., bases of the transistors Q1 and Q2. A dc voltage $V_c$ is applied in positive phase or polarity to an input end or a base of the transistor Q3.

The input-output characteristics of the triple-tail cell according to the first embodiment is obtained by the following way:

Supposing that the transistors Q1, Q2 and Q3 are matched in characteristic and ignoring the base-width modulation, collector currents $I_{C1}$, $I_{C2}$ and $I_{C3}$ of the respective transistors Q1, Q2 and Q3 can be expressed as the following equations (1), (2) and (3), respectively.

$$I_{C1} = I_S \exp\left( \frac{V_R + \frac{1}{2} V_i - V_S}{V_T} \right) \quad (1)$$

$$I_{C2} = I_S \exp\left( \frac{V_R - \frac{1}{2} V_i - V_S}{V_T} \right) \quad (2)$$

$$I_{C3} = K I_S \exp\left( \frac{V_R + V_C - V_S}{V_T} \right) \quad (3)$$

In the equations (1), (2) and (3), $V_T$ is the thermal voltage of the transistors Q1, Q2 and Q3 defined as $V_T=(kT)/q$ where k is the Boltzmann's constant, T is absolute temperature in degrees Kelvin, and q is the charge of an electron. Also, $I_S$ is the saturation current of the transistors Q1, Q2 and Q3, $V_R$ is a dc component of the input voltage $V_i$, and $V_S$ is a common emitter voltage (i.e., a voltage at a connection point of the emitters of the transistors Q1, Q2 and Q3).

The tail current $I_0$ and the collector currents $I_{C1}$, $I_{C2}$ and $I_{C3}$ satisfy the following equation (4).

$$I_{C1}+I_{C2}+I_{C3}=\alpha_F I_0 \quad (4)$$

where $\alpha F$ is the dc common-base current gain factor of the transistors Q1, Q2 and Q3.

The common term "$I_S \exp\{(V_R-V_S)/V_T\}$" contained in the equations (1), (2) and (3) is given as the following equation (5) by solving the equations (1) to (4).

$$I_S \exp\left( \frac{V_R - V_S}{V_T} \right) = \frac{\alpha_F I_0}{\left\{ 2\cosh\left( \frac{V_i}{2V_T} \right) + K \exp\left( \frac{V_C}{V_T} \right) \right\}} \quad (5)$$

From the equation (5), the collector currents $I_{C1}$, $I_{C2}$ and $I_{C3}$ are expressed as the following equations (6), (7) and (8), respectively.

$$I_{C1} = \frac{\alpha_F I_0 \exp\left( \frac{V_i}{2V_T} \right)}{\left\{ 2\cosh\left( \frac{V_i}{2V_T} \right) + K \exp\left( \frac{V_C}{V_T} \right) \right\}} \quad (6)$$

$$I_{C2} = \frac{\alpha_F I_0 \exp\left( -\frac{V_i}{2V_T} \right)}{\left\{ 2\cosh\left( \frac{V_i}{2V_T} \right) + K \exp\left( \frac{V_C}{V_T} \right) \right\}} \quad (7)$$

$$I_{C3} = \frac{K \alpha_F I_0 \exp\left( \frac{V_C}{V_T} \right)}{\left\{ 2\cosh\left( \frac{V_i}{2V_T} \right) + K \exp\left( \frac{V_C}{V_T} \right) \right\}} \quad (8)$$

Therefore, an output current $I_{RS}$ of the triple-tail cell, which is outputted through the coupled collectors of the transistors Q1 and Q2, is given by the following equation (9).

$$\begin{aligned} I_{RS} &= I_{C1} + I_{C2} \\ &= \frac{2\alpha_F I_0 \cosh\left( \frac{V_i}{2V_T} \right)}{\left\{ 2\cosh\left( \frac{V_i}{2V_T} \right) + K \exp\left( \frac{V_C}{V_T} \right) \right\}} \end{aligned} \quad (9)$$

Another output current $I_{SQ}$ of the triple-tail cell, which is outputted through the collector of the transistor Q3, is given by the following equation (10).

$$\begin{aligned} I_{SQ} &= I_{C3} \\ &= \frac{K \alpha_F I_0 \exp\left( \frac{V_C}{V_T} \right)}{\left\{ 2\cosh\left( \frac{V_i}{2V_T} \right) + K \exp\left( \frac{V_C}{V_T} \right) \right\}} \end{aligned} \quad (10)$$

One of the output currents $I_{RS}$ and $I_{SQ}$ may be used as the output of the triple-tail cell. A differential current of $I_{RS}$ and $I_{SQ}$ may be used; however, a dc offset current would occur in case of specified value or values of K.

Figure 3:
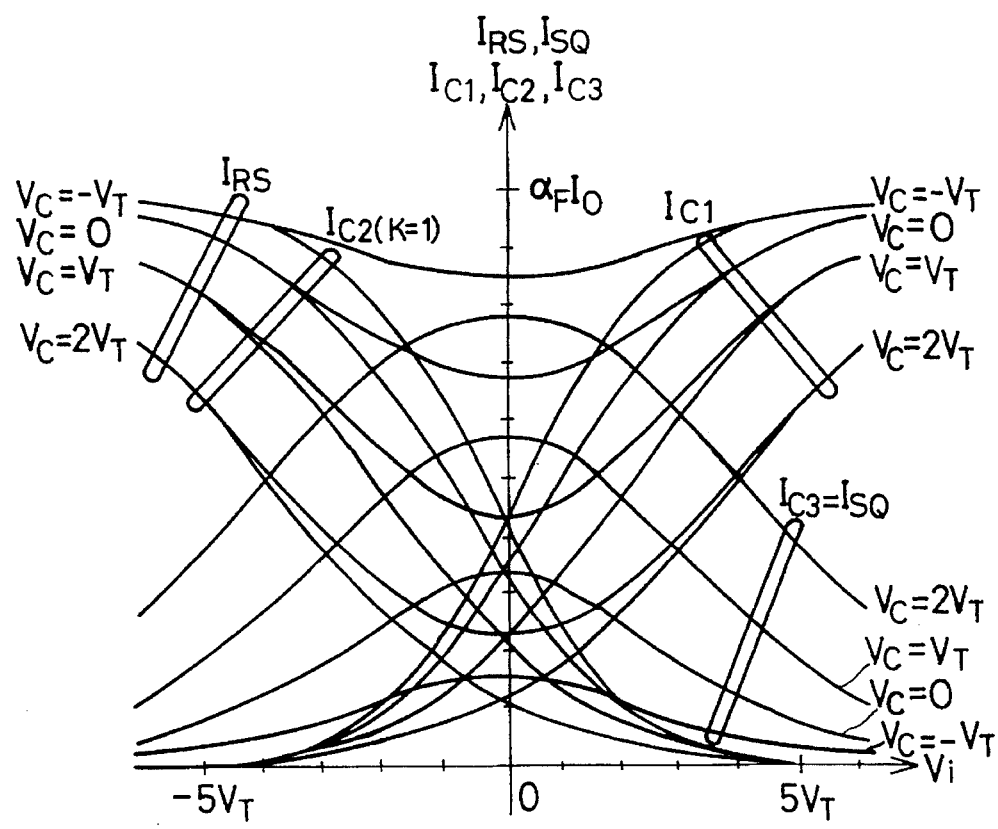
FIG. 3 shows input-output characteristics of the bipolar full-wave rectifier of FIG. 2.

FIG. 3 shows the input-output characteristic of the bipolar triple-tail cell according to the first embodiment, which shows the relationship between the output currents $I_{RS}$ and $I_{SQ}$ and the input voltage $V_i$ with the dc voltage $V_c$ as a parameter, where K=1 and $V_c$=$-V_T$, 0, $-V_T$ and $2V_T$. The relationships between the collector currents $I_{C1}$, $I_{C2}$ and $I_{C3}$ and the input voltage $V_i$ are additionally represented in FIG. 3.

It is seen from FIG. 3 that the output currents $I_{RS}$ and $I_{SQ}$ each has full-wave rectification characteristics or approximate square-law characteristics that vary dependent upon the dc voltage $V_c$ as a parameter.

When the output current $I_{RS}$ or $I_{SQ}$ of the triple-tail cell has a temperature dependency, this dependency can be compensated by varying the dc voltage $V_c$ to cancel the temperature-dependent change of the current $I_{RS}$ and $I_{SQ}$.

It is seen from FIG. 3 that the applicable range of the input voltage $V_i$ where the approximate square-law characteristics are obtained can be changed by the dc voltage $V_c$. Specifically, as the value of $V_c$ becomes large, the slopes of the transfer curves of $I_{RS}$ and $I_{SQ}$ increase at the same value of $V_i$. This means that an expanded, applicable input voltage range where the currents of $I_{RS}$ and $I_{SQ}$ can be regarded to have the square-law characteristics at large values of $V_c$ can be obtained.

Figure 4:
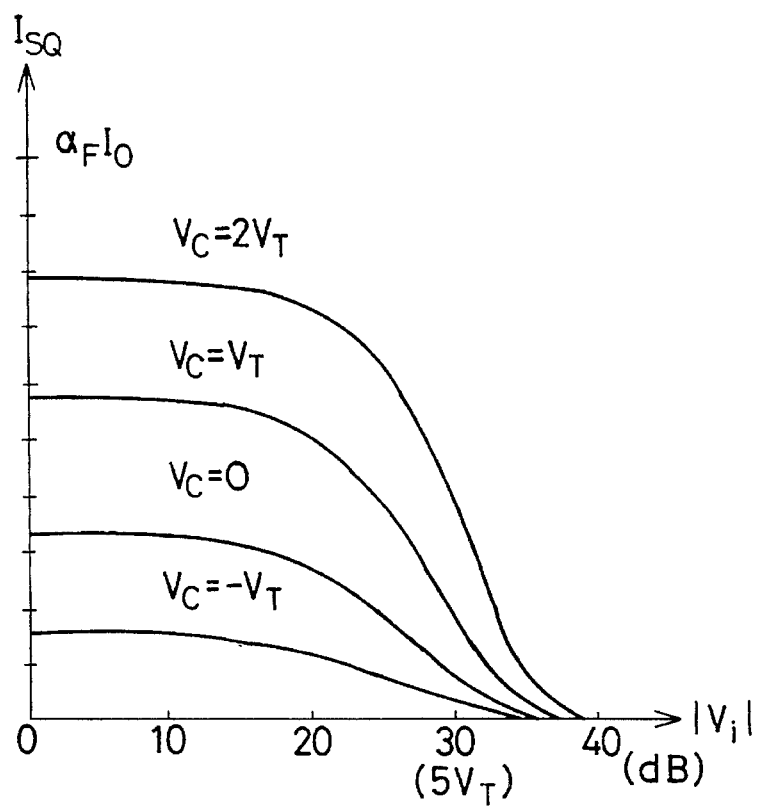
FIG. 4 shows input-output characteristics of the bipolar full-wave rectifier of FIG. 2, which is represented in decibel scale.

FIG. 4 shows input-output characteristics of the triple-tail cell according to the first embodiment on the output current $I_{SQ}$, which is represented in decibel scale at K =1.

It is seen from FIG. 4 that the input-output characteristics on the current $I_{SQ}$ can be changed by increasing or decreasing the dc voltage $V_c$, and that the input voltage $V_i$ has a dynamic range of 10 dB or more.

Thus, since the triple-tail cell according to the first embodiment (FIG. 2) is used as each of the rectifiers $B_1$ to $B_{n+1}$ of FIG. 1, the output current $I_{RSSI}$ and the output voltage $V_{RSSI}$ outputted from the adder ADD have logarithmic transfer characteristics.

Considering the operating input voltage range of the bipolar triple-tail cell of FIG. 2, the input voltage $V_{IN}$ of the logarithmic amplifier circuit of FIG. 1 has a dynamic range of about 10 dB, and therefore, the gains of the differential amplifiers $A_1$ to $A_n$ need to be restricted up to about ten and several dB, respectively.

shows the input output characteristic of the logarithmic amplifier circuit according to the first embodiment, in which the input-output characteristics of the triple-tail cells or the full-wave rectifiers $B_1$ to $B_{n+1}$ are additionally shown. The reference numeral 32 denotes the transfer curve of the logarithmic amplifier circuit or the output current $I_{RSSI}$ of the adder ADD. The reference numerals $31_1$ to $31_{n+1}$ denote the transfer curves of the rectifiers $B_1$ to $B_{n+1}$ or the output currents $I_{SQ1}$ to $I_{SQ(n+1)}$ thereof.

Since the initial input voltage $V_{IN}$ is successively amplified in the cascaded differential amplifiers $A_1$ to $A_n$, i.e., the input voltage to each amplifier successively increases from the first stage to the n-th stage. This means that the input voltages to the rectifiers $B_1$ to $B_{n+1}$ successively increase from the first stage to the n-th stage.

Consequently, as the initial input voltage $V_{IN}$ increases, the output currents $I_{SQ(n+1)}$ to $I_{SQ1}$ start to drop at the specified values of $V_{IN}$, respectively. The earliest drop of the current occurs in the rectifier $B_{(n+1)}$ at the last stage, and the subsequent drops successively occur in the remaining rectifiers $B_n$ to $B_1$ toward the first stage. When the output current of the rectifier at one of the n stages drops to zero (0), the output current of the rectifier at the next stage starts to drop along one of the logarithmic transfer curves $31_1$ to $31_{n+1}$. Thus, the logarithmic characteristics of the circuit of FIG. 1 can be obtained together with a wider dynamic range of $V_{IN}$.

With the logarithmic amplifier circuit according to the first embodiment, since each of the rectifiers $B_1$ to $B_{(n+1)}$ is composed of the bipolar triple-tail cell, the number of necessary current sources can be reduced.

Also, the differential pair is composed of the two balanced bipolar transistors Q1 and Q2 and the collectors are coupled together to form the output ends of the triple-tail cell. Therefore, the parasitic capacitances at the output ends of the cell decrease. Accordingly, the driving current consumption becomes lower at the same frequency of the initial input voltage Vi, which results in power consumption reduction.

Further, the input-output characteristics of the triple-tail cell vary by changing the values of the dc voltage Vc applied to the base of the bipolar transistor Q3, and as a result, the logarithmic characteristics can be adjusted as required.

SECOND EMBODIMENT

A logarithmic amplifier circuit according to a second embodiment has the same configuration as shown in FIG. 1. Each of the (n+1) full-wave rectifiers $B_1$ to $B_{(n+1)}$ is composed of an MOS triple-tail cell shown in FIG. 6, which is equivalent to one that the bipolar transistors Q1, Q2 and Q3 are replaced by MOSFETs in FIG. 2.

Figure 6:
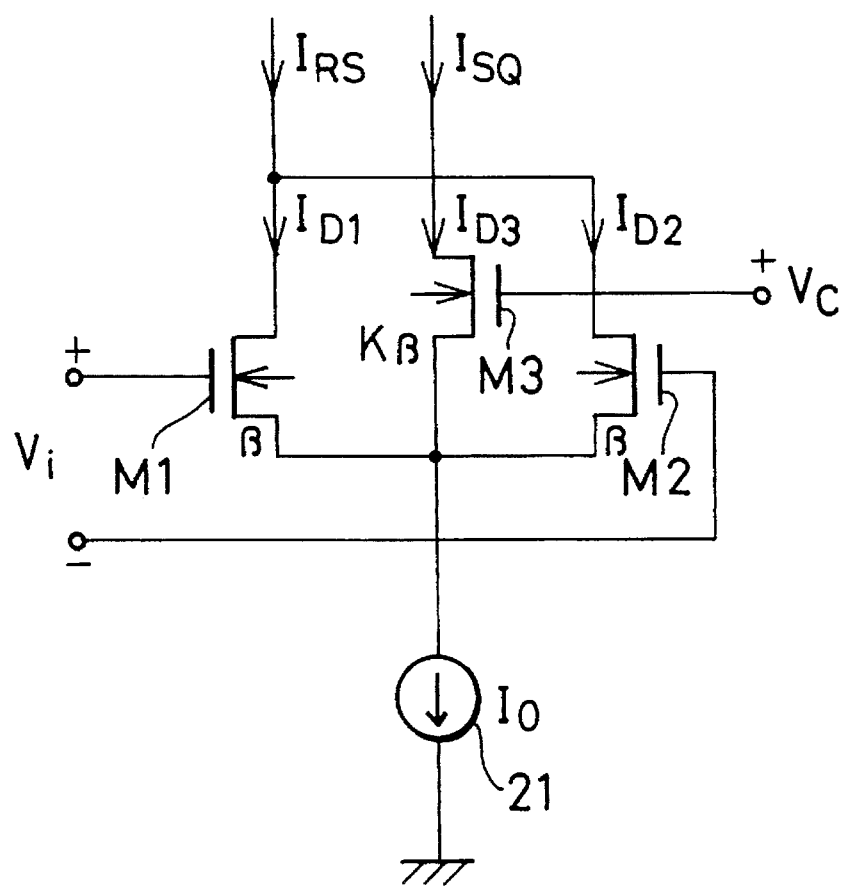
FIG. 6 is a circuit diagram of a full-wave rectifier according to the second embodiment, which is used for the logarithmic amplifier circuit of FIG. 1 and is made of an MOS triple-tail cell.

In FIG. 6, the full-wave rectifier or triple-tail cell contains a differential pair of source-coupled channel MOSFETs M1 and M2, an n-channel MOSFET M3, and a constant current source 21 generating a tail current $I_0$. The MOSFETs M1, M2 and M3 are driven by the tail current $I_0$.

A source of the MOSFET M3 is connected to the coupled sources of the MOSFETs M1 and M2. An end of the current source 21 is connected to the coupled sources of the MOSFETs M1, M2 and M3, and the other end thereof is grounded. Drains of the MOSFETs M1 and M2 are coupled together to form an output end of the cell and a drain of the MOSFET M3 forms the other output end thereof.

The MOSFETs M1 and M2 forming the differential pair have ratios (W/L) equal to each other. The MOSFET M3 has a ratio (W/L) K times as large as those of the MOSFETs M1 and M2, where K>0. W is the gate width of each MOSFET and L is the gate length thereof. The constant K may be unity (1), and it may be greater or less than unity.

A differential input voltage $V_i$ is applied across input ends of the differential pair, i.e., gates of the MOSFETs M1 and M2. A dc voltage $V_c$ is applied in positive phase or polarity to an input end or a gate of the MOSFET M3.

The input-output characteristics of the triple-tail cell according to the second embodiment is obtained by the following way:

Supposing that the MOSFETS M1, M2 and M3 are matched in characteristic and that they operate in the saturation region, and ignoring the body effect and the channel-length modulation, drain currents $I_{D1}$, $I_{D2}$ and $I_{D3}$ of the respective MOSFETs M1, M2 and M3 can be expressed as the following equations (11), (12) and (13), respectively.

$$I_{D1}=\beta(V_R+\tfrac{1}{2}V_i-V_S-V_{TH})^2 \tag{11}$$

$$I_{D2}=\beta(V_R-\tfrac{1}{2}V_i-V_S-V_{TH})^2 \tag{12}$$

$$I_{D3}=K\beta(V_R+V_C-V_S-V_{TH})^2 \tag{13}$$

In the equations (11), (12) and (13), $\beta$ is the transconductance parameter of the MOSFETs and $V_{TH}$ is the threshold voltage thereof. $\beta$ is expressed as $\mu(C_{OX}/2)(W/L)$ where $\mu$ is the effective carrier mobility, and $C_{OX}$ is the gate oxide capacitance per unit area. Also, $V_S$ is the common source voltage of the MOSFETs M1, M2 and M3 (i.e., a voltage at a connection point of the sources of the MOSFETs M1, M2 and M3).

The tail current IO and the collector currents IC1, IC2 and IC3 satisfy the following equation (14).

$$I_{D1}+I_{D2}+I_{D3}=I_0 \tag{14}$$

Solving the equations (11) to (14) provides an output current $I_{RS}$ of the triple-tail cell, which is outputted through the coupled drains of the MOSFETs M1 and M2, as shown in the following equations (15a), (15b) and (15c).

$$I_{RS} = I_{D1} + I_{D2} \quad (15a)$$
$$= \beta \left[ \frac{KV_i^2}{2(K+2)} + \frac{2K(K-2)}{(K+2)^2} V_C^2 \right.$$
$$\left. + \frac{4KV_C}{(K+2)^2} \sqrt{\frac{(K+2)I_0}{\beta} - \frac{(K+2)}{2} V_i^2 - 2KV_C^2} \right] + \frac{2I_0}{(K+2)}$$
$$\left( |V_i| \leq \sqrt{\frac{2I_0}{\beta} - 4V_C^2} \;,\; |V_i| \leq \frac{-2KV_C + \sqrt{\frac{(K+4)I_0}{\beta} - 4KV_C^2}}{(K+4)} \right)$$

$$I_{RS} = I_{D1} + I_{D2} \quad (15b)$$
$$= \frac{\beta K(K-1)(|V_i| - V_C)^2}{(K+2)^2}$$
$$+ \frac{K\beta(|V_i| - V_C)}{2(K+2)^2} \sqrt{\frac{(K+2)I_0}{\beta} - K(|V_i| - V_C)^2} + \frac{(K-1)}{2(K+1)} I_o$$
$$\left( \min\left\{ \sqrt{\frac{2I_0}{\beta} - 4V_C^2} \;,\; \frac{-2KV_C + \sqrt{\frac{(K+4)I_0}{\beta} - 4KV_C^2}}{(K+4)} \right\} \leq |V_i| \leq 2 \right)$$

$$I_{RS} = I_{D1} + I_{D2} \quad (15C)$$
$$= I_0 \; (2 \leq |V_i|)$$

Similarly, another output current $I_{SQ}$ thereof, which is outputted through the drain of the MOSFET M3, is given by the following equation (16a), (16b) and (16c).

$$I_{SQ} = I_{D3} \quad (16a)$$
$$= -\beta \left[ \frac{KV_i^2}{2(K+2)} + \frac{2K(K-2)}{(K+2)^2} V_C^2 \right.$$
$$\left. + \frac{4KV_C}{(K+2)^2} \sqrt{\frac{(K+2)I_0}{\beta} - \frac{(K+2)}{2} V_i^2 - 2KV_C^2} \right] + \frac{KI_0}{(K+2)}$$
$$\left( |V_i| \leq \sqrt{\frac{2I_0}{\beta} - 4V_C^2} \;,\; |V_i| \leq \frac{-2KV_C + 2\sqrt{\frac{(K+4)I_0}{\beta} - 4KV_C^2}}{(K+4)} \right)$$

$$I_{SQ} = I_{D3} \quad (16b)$$
$$= -\frac{K\beta(|V_i| - V_C)}{2(K+2)^2} \sqrt{\frac{(K+2)I_0}{\beta} - K(|V_i| - V_C)^2} + \frac{(K-1)}{2(K+1)} I_o$$
$$- \frac{\beta K(K-1)(|V_i| - V_C)^2}{(K+2)^2}$$
$$\left( \min\left\{ \sqrt{\frac{2I_0}{\beta} - 4V_C^2} \;,\; \frac{-2KV_C + 2\sqrt{\frac{(K+4)I_0}{\beta} - 4KV_C^2}}{(K+4)} \right\} \leq |V_i| \leq 2 \right)$$

$$I_{SQ} = I_{D3} \quad (16C)$$
$$= 0 \; (2 \leq |V_i|)$$

Similar to the first embodiment, one of the output currents $I_{RS}$ and $I_{SQ}$ may be used as the output of the triple-tail cell. A differential current of $I_{RS}$ and $I_{SQ}$ may be used; however, a dc offset current would occur in case of specified value or values of K.

Figure 7:
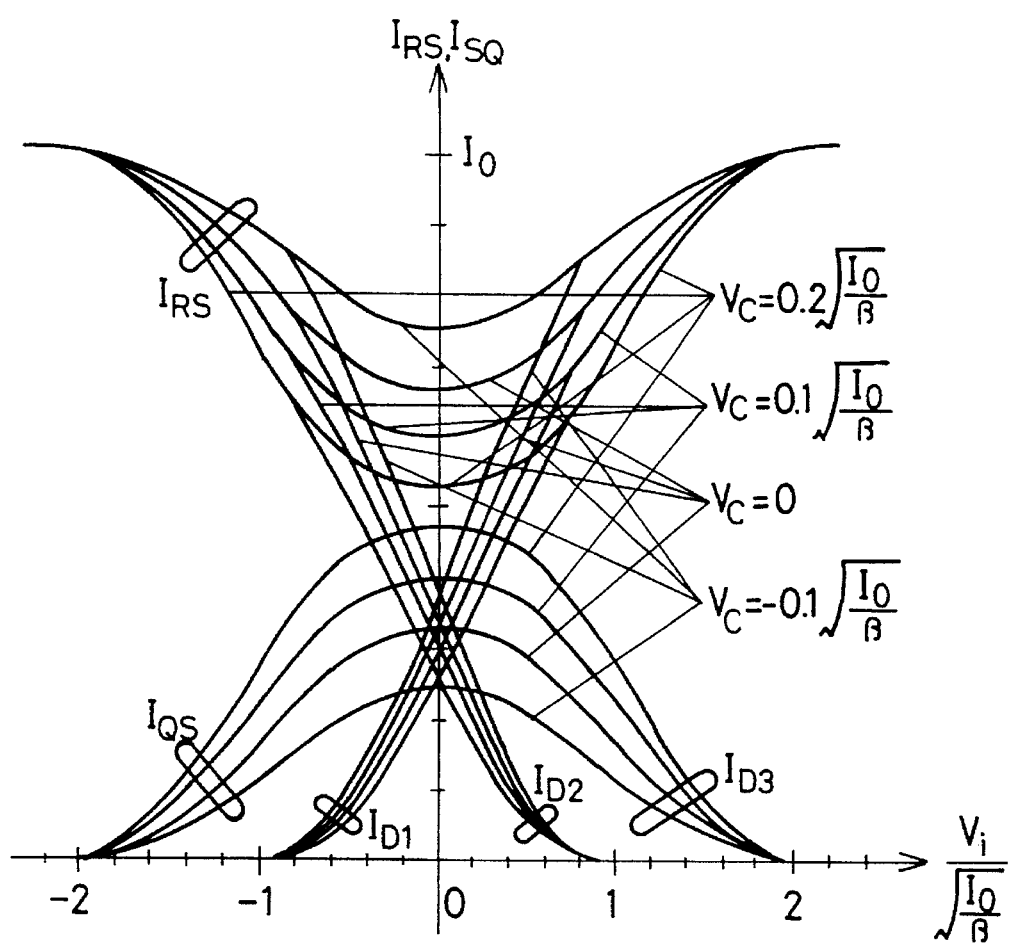
FIG. 7 shows an input-output characteristic of the MOS full-wave rectifier of FIG. 6.

FIG. 7 shows the input-output characteristic of the MOS triple-tail cell according to the second embodiment, which shows the relationship between the output currents $I_{RS}$ and $I_{SQ}$ and the input voltage $V_i$ with the dc voltage $V_c$ as a parameter, where $K=1$ and $V_c=-0.1(I_0/\beta)^{1/2}$, $0$, $0.1(I_0/\beta)^{1/2}$ and $0.2(I_0/\beta)^{1/2}$.

It is seen from FIG. 7 that the output currents $I_{RS}$ and $I_{SQ}$ each has approximate square-law characteristics that vary dependent upon the dc voltage $V_c$ as a parameter.

If the range of the input voltage $V_i$ is limited to satisfy the following equation (17), ideal square-law characteristics can be obtained.

$$|V_i| \leq \min \sqrt{\frac{2I_0}{\beta} - 4V_C^2} \;, \quad (17)$$

$$\left[ -2KV_C + 2\sqrt{\frac{(K+4)I_0}{\beta} - \frac{4K}{V_C^2}} \right]$$

Unlike the bipolar triple-tail cell in the first embodiment, the output currents $I_{RS}$ and $I_{SQ}$ of this MOS triple-tail cell have the same characteristic as each other. Specifically, the coefficients of the square-terms ($V_i^2$) of the currents $I_{RS}$ and $I_{SQ}$ are equal to $\{K/\{2(K+2)\}\}$ (refer to the equations (15a) and (16a)).

It is seen from FIG. 7 that the applicable range of the input voltage $V_i$ where the square-law characteristics are obtained can be changed by the dc voltage $V_c$. Specifically, as the value of $V_c$ becomes large, the slopes of the transfer curves of $I_{RS}$ and $I_{SQ}$ increase at the same value of $V_i$. This means that an expanded, applicable input voltage range where the currents of $I_{RS}$ and $I_{SQ}$ can be regarded to have the square-law characteristics at large values of $V_c$ can be obtained.

Figure 8:
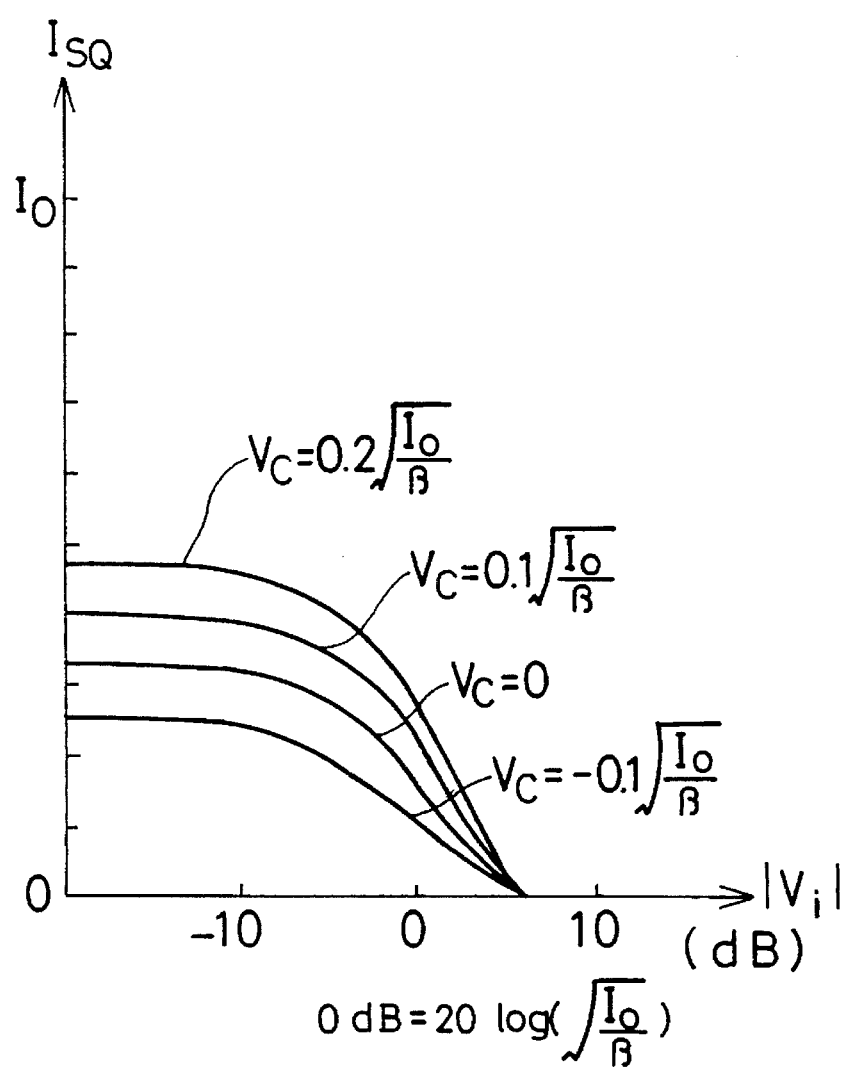
FIG. 8 shows input-output characteristics of the MOS full-wave rectifier of FIG. 6, which is represented in decibel scale.

FIG. 8 shows input-output characteristics of the MOS triple-tail cell according to the second embodiment on the output current $I_{SQ}$, which is represented in decibel scale at K =1.

It is seen from FIG. 8 that the input-output characteristics on the current $I_{SQ}$ can be changed by increasing or decreasing the dc voltage $V_c$, and that the input voltage $V_i$ has a dynamic range of about 8 dB.

Thus, since the MOS triple-tail cell according to the second embodiment (FIG. 6) is used as each of the rectifiers $B_1$ to $B_{n+1}$ of FIG. 1, the output current $I_{RSSI}$ and the output voltage $V_{RSSI}$ outputted from the adder ADD have logarithmic transfer characteristics.

Considering the operating input voltage range of the MOS triple-tail cell of FIG. 6, the input voltage $V_{IN}$ of the logarithmic amplifier circuit of FIG. 1 has a dynamic range of about 10 dB, and therefore, the gains of the differential amplifiers $A_1$ to $A_n$ need to be restricted up to about ten and several dB, respectively.

With the logarithmic amplifier circuit according to the second embodiment, the same advantages as those in the first embodiment can be obtained.

THIRD EMBODIMENT

As described above, the input voltage $V_i$ of the triple-tail cell of FIG. 2 or 6 has a dynamic range of about 10 dB. Therefore, when the bipolar or MOS triple-tail cell of FIG. 2 or 6 is used as each of the rectifiers in FIG. 1, no satisfactory high logarithmic accuracy can be obtained unless the gains of the respective differential amplifiers $A_1$ to $A_n$ are restricted up to about 10 dB.

Typically, the gains of the amplifiers $A_1$ to $A_n$ can be made up to about 20 dB and therefore, if the input dynamic ranges of the rectifiers $B_1$ to $B_{n+1}$ become sufficiently wide, the number of the stages, i.e., the number of the amplifiers $A_1$ to $A_n$ can be reduced. A logarithmic amplifier circuit according to a third embodiment, which is described below, has such a wider dynamic range of about 20 dB.

The logarithmic amplifier circuit according to the third embodiment has the same configuration as shown in FIG. 1. Each of the (n+1) full-wave rectifiers $B_1$ to $B_{n+1}$ is composed of a bipolar subcircuit as shown in FIG. 9 that contains a plurality of the bipolar triple-tail cells of FIG. 2.

Figure 9:
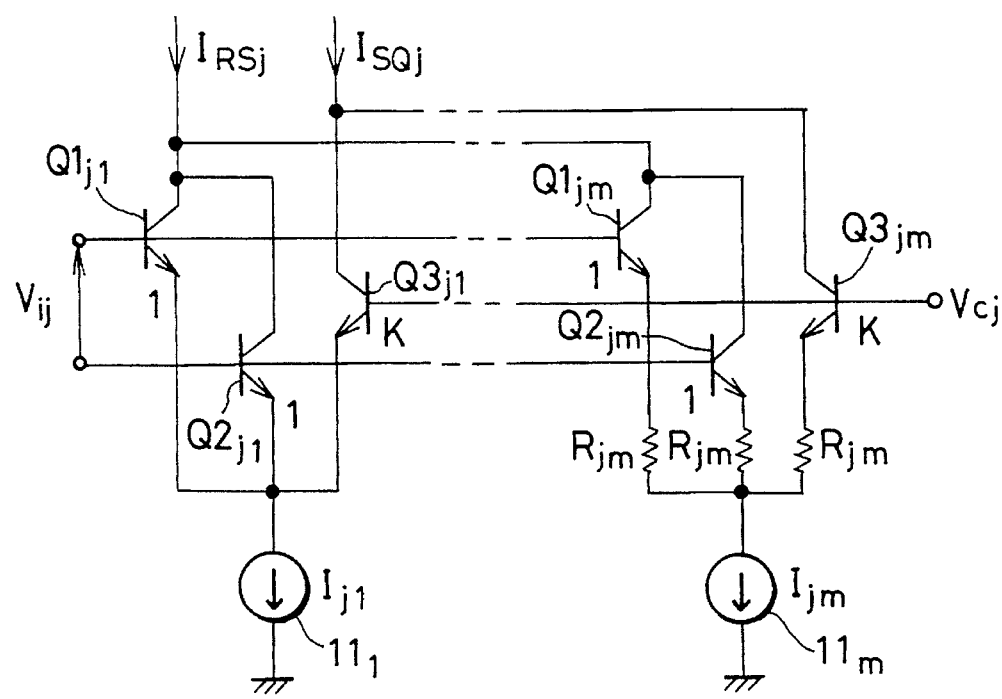
FIG. 9 is a circuit diagram of a full-wave rectifier according to the third embodiment, which is used for the logarithmic amplifier circuit of FIG. 1 and is made of a plurality of parallel-connected bipolar triple-tail cells.

In FIG. 9, this subcircuit contains first to m-th bipolar triple-tail cells of FIG. 2 that are connected in parallel, where m is a natural number. The first triple-tail cell is made of bipolar transistors $Q1_{j1}$, $Q2_{j1}$ and $Q3_{j1}$ and a constant current source $11_1$ producing a tail current $I_{j1}$. The m-th triple-tail cell is made of bipolar transistors $Q1_{jm}$, $Q2_{jm}$ and $Q3_{jm}$ having emitter resistors (resistance: $R_{jm}$), and a constant current source $11_m$ producing a tail current $I_{jm}$. Although not shown here, the second to (m−1)-th triple-tail cells are the same in configuration as that of the m-th triple-tail cell.

Bases of the first to m-th transistors $Q1_{j1}$ to $Q1_{jm}$ are coupled together and bases of the first to m-th transistors $Q2_{j1}$ to $Q2_{jm}$ are coupled together. The input voltage $V_{ij}$ is applied across the coupled bases of the transistors $Q1_{j1}$ to $Q1_{jm}$ and the coupled bases of the transistors $Q2_{j1}$ to $Q2_{jm}$. Bases of the first to m-th transistors $Q3_{j1}$ to $Q3_{jm}$ are coupled together to be applied with a dc voltage $V_{cj}$.

Collectors of the first to m-th transistors $Q1_{j1}$ to $Q1_{jm}$ Q1j1 to Q1jm and $Q2_{j1}$ to $Q2_{jm}$ are coupled together to form an output end. Collectors of the first to m-th transistors of the transistors $Q3_{j1}$ to $Q3_{jm}$ are coupled together to form the other end thereof.

It has been known that the emitter resistors for emitter degeneration enable to expand the operating input voltage range of the triple-tail cell according to the product of the values of the emitter resistance and the tail current. In the third embodiment, if the input voltage ranges for the first triple-tail cell having no emitter resistor and the second to m-th triple-tail cells each having the emitter resistors are determined so that the respective input voltage ranges increase or decrease exponentially or like a geometric progression, the rectification characteristic of the bipolar subcircuit itself can be approximated near to the true logarithmic characteristic in a wider input voltage range.

Accordingly, the input voltage range of the rectifier or subcircuit of FIG. 9 can be adjusted to be accorded with the gain of the corresponding one of the differential amplifiers $A_1$ to $A_n$.

FOURTH EMBODIMENT

Figure 10:
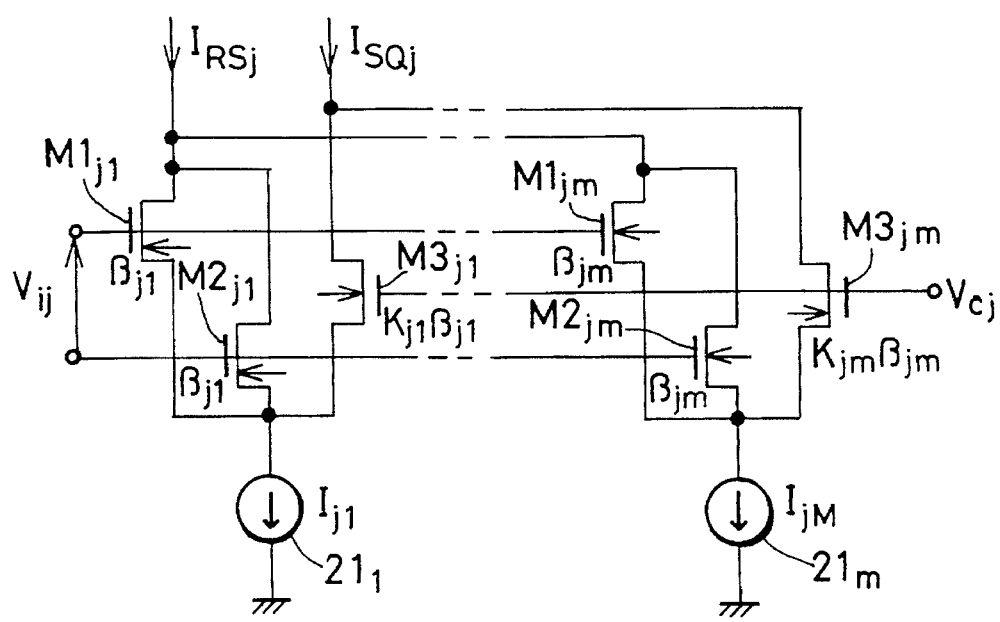
FIG. 10 is a circuit diagram of a full-wave rectifier according to the fourth embodiment, which is used for the logarithmic amplifier circuit of FIG. 1 and is made of a plurality of parallel-connected MOS triple-tail cells.

A logarithmic amplifier circuit according to the fourth embodiment has the same configuration as shown in FIG. 1, and each of the (n+1) full-wave rectifiers $B_1$ to $B_{n+1}$ is composed of an MOS subcircuit shown in FIG. 10 which contains a plurality of the MOS triple-tall cells of FIG. 6.

In FIG. 10, this subcircuit contains first to m-th MOS triple-tail cells of FIG. 6 that are connected in parallel, where m is a natural number. The first triple-tail cell is made of MOSFETs $M1_{j1}$, $M2_{j1}$ and $M3_{j1}$ and a constant current source $21_1$ producing a tail current $I_{j1}$. The m-th triple-tail cell is made of MOSFETs $M1_{jm}$, $M2_{jm}$ and $M3_{jm}$ and a constant current source $21_m$ producing a tail current $I_{jm}$. Although not shown here, the second to (m−1)-th triple-tail cells are the same in configuration as that of the m-th triple-tail cell.

Gates of the first to m-th MOSFETs $M1_{j1}$ to $M1_{jm}$ are coupled together and gates of the first to m-th MOSFETs $M2_{j1}$ to $M2_{jm}$ are coupled together. The input voltage $V_{ij}$ is applied across the coupled gates of the MOSFETs $M1_{j1}$ to $M1_{jm}$ and the coupled gates of the MOSFETS $M2_{j1}$ to $M2_{jm}$. Gates of the first to m-th MOSFETs $M3_{j1}$ to $M3_{jm}$ are coupled together to be applied with a dc voltage $V_{CJ}$.

Drains of the first to m-th MOSFETs $M1_{j1}$ to $M1_{jm}$ and $M1_{j1}$ to $M2_{jm}$ are coupled together to form an output end. Drains of the first to m-th MOSFETs $M3_{j1}$ to $M3_{jm}$ are coupled together to form the other end thereof.

The MOSFET scarcely has a resistor at its source for the degeneration purpose and therefore, the subcircuit of FIG.

10 cannot employ such the emitter resistors as above. However, in the MOS triple-tail cell, the input voltage range varies according to the product of the values of the transconductance parameter and the tail current. This means that the input voltage ranges of the first to m-th MOS triple-tail cells can be changed by the product values while the rectification characteristics of the first to m-th MOS triple-tail cells are analogous to each other. If the relationship is represented on a graph in logarithmic scale as shown in FIG. 8, the abscissa axis, i.e., the axis of $V_{IN}$, simply shifts laterally and no change is generated in the slopes of the rectification transfer curves.

For example, when the product values of the transconductance parameters and the tail currents increase or decrease by $6(I_0/\beta)^{1/2}$ in sequence for the first to m-th cells, the input voltage ranges for the two neighboring cells are different from each other by 8 dB. Therefore, in this case, the rectification characteristic of the MOS subcircuit itself can be approximated near to the true logarithmic characteristic in a wider input voltage range.

Accordingly, similar to the third embodiment of FIG. 9, the input voltage range of the rectifier or subcircuit of FIG. 10 can be adjusted to be accorded with the gain of the corresponding one of the differential amplifiers $A_1$ to $A_n$.

FIFTH EMBODIMENT

Figure 11:
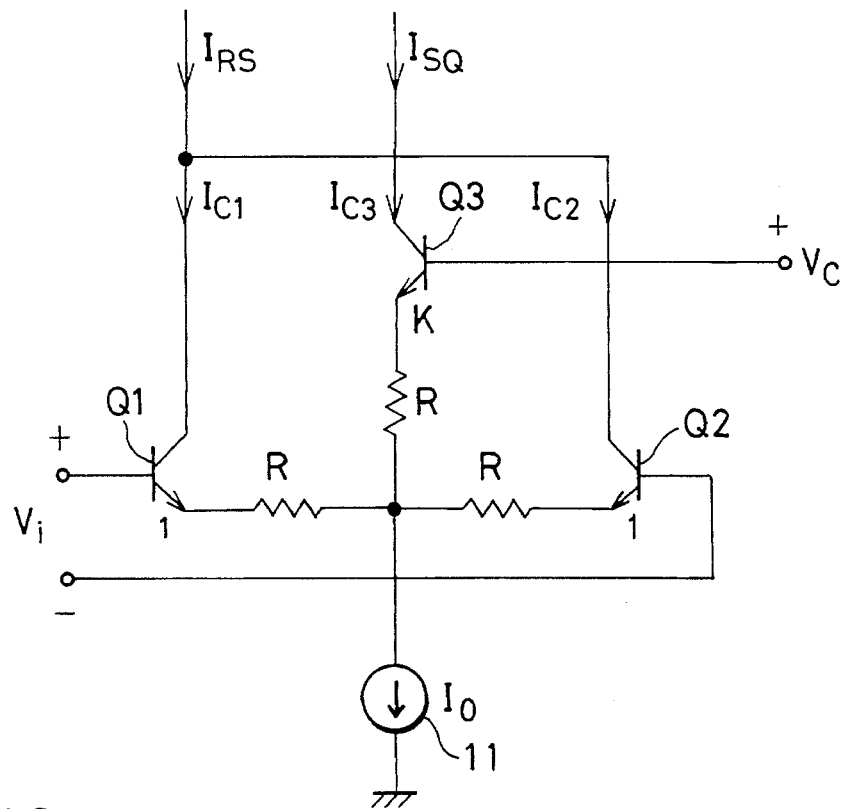
FIG. 11 is a circuit diagram of a full-wave rectifier according to the fifth embodiment, which is used for the logarithmic amplifier circuit of FIG. 1g and is made of a bipolar triple-tail cell having emitter resistors.

FIG. 11 shows a bipolar triple-tail cell used for a logarithmic amplifier circuit according to a fifth embodiment as each of the (n+1) full-wave rectifiers $B_1$ to $B_{n+1}$ in FIG. 1.

The bipolar triple-tail circuit of FIG. 11 has the same configuration as shown in FIG. 2 except for emitter resistors (resistance: R) connected to the respective transistors Q1, Q2 and Q3 at their emitters for the emitter degeneration purpose.

In the fifth embodiment, the input voltage range of the triple-tail cell can be expanded-compared with that of first embodiment of FIG. 2.

A plurality of the bipolar triple-tail cell of the fifth embodiment may be connected in parallel to form a full-wave rectifier similar to that of FIG. 9.

SIXTH EMBODIMENT

Figure 12:
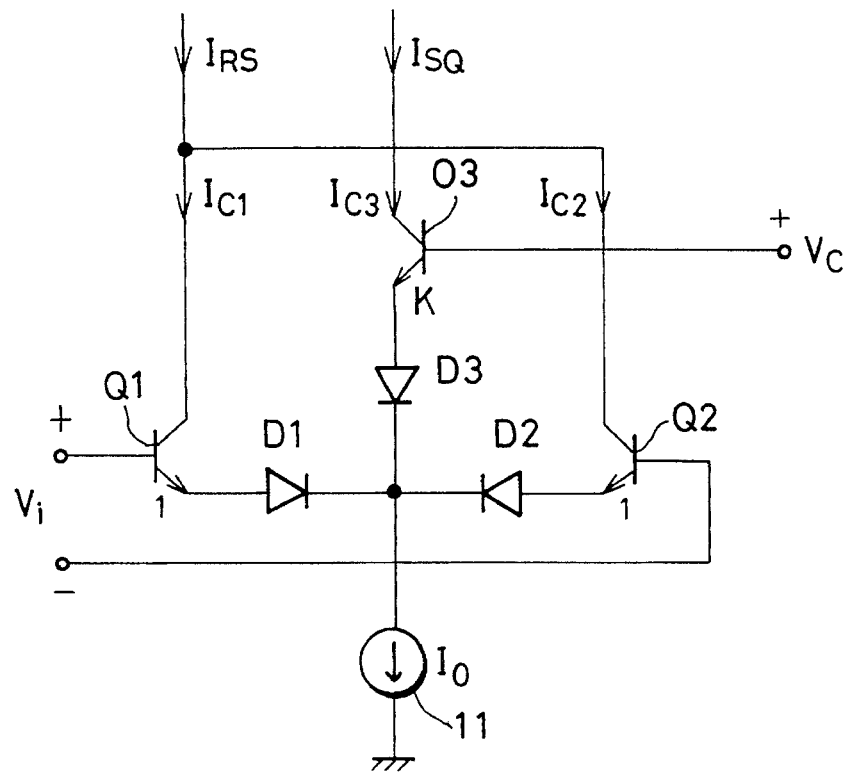
FIG. 12 is a circuit diagram of a full-wave rectifier according to the sixth embodiment, which is used for the logarithmic amplifier circuit of FIG. 1 and is made of a bipolar triple-tail cell having emitter diodes.

FIG. 12 shows a bipolar triple-tail cell used for a logarithmic amplifier circuit according to a sixth embodiment as each of the (n+1) full-wave rectifiers $B_1$ to $B_{n+1}$ in FIG. 1.

The bipolar triple-tail circuit of FIG. 12 has the same configuration as shown in FIG. 2 except for emitter diodes D1, D2 and D3 connected to the respective transistors Q1, Q2 and Q3 at their emitters for the emitter degeneration purpose.

In the sixth embodiment, the input voltage range of the triple-tail cell can be expanded to twice as wide as than of first embodiment of FIG. 2. However, it is required to increase the supply voltage by about 0.7 volt.

A plurality of the bipolar triple-tail cell of the sixth embodiment may be connected in parallel to form a full-wave rectifier similar to that of FIG. 9.

SEVENTH EMBODIMENT

Figure 13:
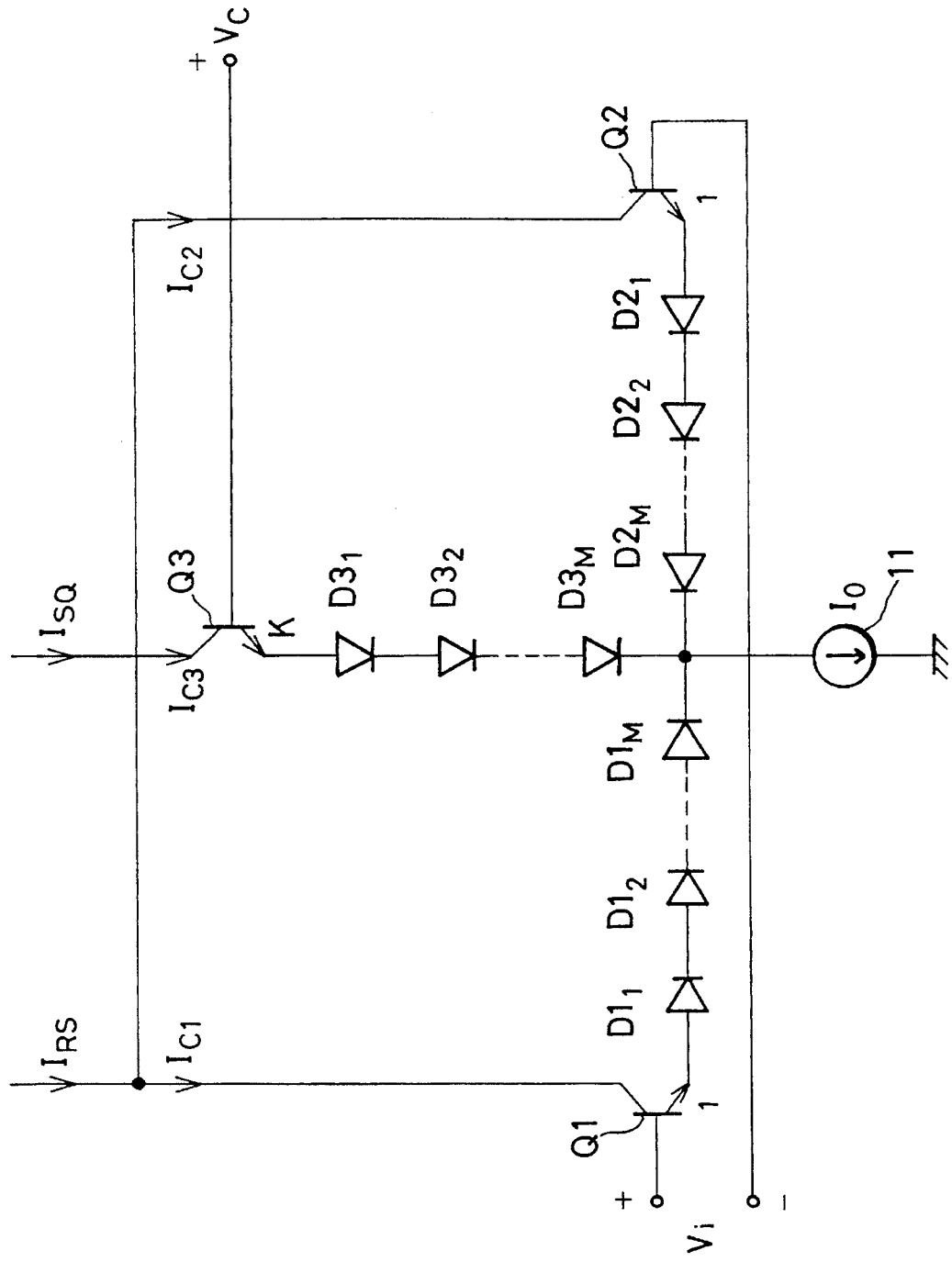
FIG. 13 is a circuit diagram of a full-wave rectifier according to the seventh embodiment, which is used for the logarithmic amplifier circuit of FIG. 1 and is made of a bipolar triple-tail cell having emitter diodes.

FIG. 13 shows a bipolar triple-tail cell used for a logarithmic amplifier circuit according to a seventh embodiment as each of the (n+1) full-wave rectifiers $B_1$ to $B_{n+1}$ in FIG. 1.

The bipolar triple-tail circuit of FIG. 13 has the same configuration as shown in FIG. 2 except for sets of series-connected emitter diodes $D1_1$ to $D1_M$, series-connected emitter diodes $D2_1$ to $D2_M$ and series-connected emitter diodes $D3_1$ to $D3_M$ for the emitter degeneration purpose, where M is a natural number. The set of the diodes $D1_1$ to $D1_M$ is connected to the emitter of the transistor Q1, the set of the diodes $D2_1$ to $D2_M$ is connected to the emitter of the transistor Q2, the set of the diodes $D3_1$ to $D3_M$ is connected to the emitter of the transistor Q3.

In the seventh embodiment, the input voltage range of the triple-tail cell can be expanded to (M+1) times as wide as that of first embodiment of FIG. 2. However, it is required to increase the supply voltage by about (0.7×M) volt.

A plurality of the bipolar triple-tail cell of the seventh embodiment may be connected in parallel to form a full-wave rectifier similar to that of FIG. 9.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A logarithmic amplifier circuit comprising:
    (a) a differential amplifier producing an amplified output signal in response to an initial input signal;
    (b) a first rectifier for rectifying said initial input signal and for generating a first rectified output signal;
    (c) a second rectifier for rectifying said amplified output signal produced by said differential amplifier and for generating a second rectified output signal;
    (d) an adder for adding said first rectified output signal and said second rectified output signal to produce an output signal having a logarithmic characteristic as an output of said logarithmic amplifier circuit;
    (e) said first rectifier including a first differential pair of first and second bipolar transistors whose emitters are coupled together, a third bipolar transistor whose emitter is connected to said coupled emitters, and a first current source connected with said emitters of said first, second and third transistors;
    said first, second and third transistors being driven by a first tail current produced by said first current source;
    said initial input signal being applied across bases of said first and second transistors, and a first dc voltage being applied to a base of said third transistor;
    said first and second transistors having collectors coupled together and a first output current being outputted through said coupled collectors of said first and second transistors;
    a second output current being outputted through a collector of said third transistor;
    one of said first output current, said second output current, and a differential current of said first and second output currents being used as said first rectified output signal; and
    (f) said second rectifier including a second differential pair of fourth and fifth bipolar transistors whose emitters are coupled together, a sixth bipolar transistor whose emitter is connected to said coupled emitters, and a second current source connected with said emitters of said fourth, fifth and sixth transistors;
    said fourth, fifth and sixth transistors being driven by a second tail current produced by said second current source;

said amplified output signal being applied across bases of said fourth and fifth transistors, and a second dc voltage being applied to a base of said sixth transistor;

said fourth and fifth transistors having collectors coupled together and a third output current being outputted through said coupled collectors of said fourth and fifth transistors;

a fourth output current being outputted through a collector of said sixth transistor;

one of said third output current, said fourth output current, and a differential current of said third and fourth output currents being used as said second rectified output signal.

2. A circuit as claimed in claim 1, wherein said first and second transistors have emitter areas equal to each other and said third transistor has an emitter area different from those of the first and second transistors;

and wherein said fourth and fifth transistors have emitter areas equal to each other and said sixth transistor has an emitter area different from those of the fourth and fifth transistors.

3. A circuit as claimed in claim 1, wherein said first, second and third transistors have emitter areas equal to each other, and wherein said fourth, fifth and sixth transistors have emitter areas equal to each other.

4. A circuit as claimed in claim 1, wherein each of said first, second and third transistors has a resistor at its emitter for emitter degeneration.

5. A circuit as claimed in claim 1, wherein each of said first, second and third transistors has at least one diode at its emitter for emitter degeneration.

6. A logarithmic amplifier circuit comprising:

(a) a differential amplifier producing an amplified output signal in response to an initial input signal;

(b) a first rectifier for rectifying said initial input signal and for generating a first rectified output signal, said first rectifier having triple-tail cells connected in parallel;

(c) a second rectifier for rectifying said amplified output signal from said differential amplifier and for generating a second rectified output signal, said second rectifier having triple-tail cells connected in parallel;

(d) an adder for adding said first rectified output signal and said second rectified output signal to produce an output signal having a logarithmic characteristic as an output of said logarithmic amplifier circuit;

(e) each of said triple-tail cells of said first rectifier including a first differential pair of first and second bipolar transistors whose emitters are coupled together, a third bipolar transistor whose emitter is connected to said coupled emitters, and a first current source connected with said emitters of said first, second and third transistors;

said first, second and third transistors being driven by a first tail current produced by said first current source;

said initial input signal being applied across bases of said first and second transistors of said first triple-tail cells, and a first dc voltage being applied to bases of said third transistors thereof;

said first and second transistors having collectors coupled together and a first output current being outputted through said coupled collectors;

a second output current being outputted through coupled collectors of said third transistors of said first triple-tail cells;

one of said first output current, said second output current, and a differential current of said first and second output currents being used as said first rectified output signal; and (f) each of said triple-tail cells of said second rectifier including a second differential pair of fourth and fifth bipolar transistors, a sixth bipolar transistor whose emitter is connected to said coupled emitters, and a second current source connected with said emitters of said fourth, fifth and sixth transistors;

said fourth, fifth and sixth transistors being driven by a second tail current produced by said second current source;

said amplified output signal from said differential amplifier being applied across bases of said fourth and fifth transistors of said second triple-tail cells, and a second dc voltage being applied to bases of said sixth transistors thereof;

said fourth and fifth transistors having collectors coupled together and a third output current being outputted through said coupled collectors;

a fourth output current being outputted through coupled collectors of said sixth transistors of said second triple-tail cells;

one of said third output current, said fourth output current, and a differential current of said third and fourth output currents being used as said second rectified output signal.

7. A circuit as claimed in claim 6, wherein said first and second transistors have emitter areas equal to each other and said third transistor has an emitter area different from those of the first and second transistors in each of said triple-tail cells of said first rectifier;

and wherein said fourth and fifth transistors have emitter areas equal to each other and said sixth transistor has an emitter area different from those of the fourth and fifth transistors in each of said triple-tail cells of said second rectifier.

8. A circuit as claimed in claim 6, wherein said first, second and third transistors have emitter areas equal to each other in each of said triple-tail cells of said first rectifier;

and wherein said fourth, fifth and sixth transistors having emitter areas equal to each other in each of said triple-tail cells of said second rectifier.

9. A circuit as claimed in claim 6, wherein each of said triple-tail cells of said first rectifier has a different input voltage range from the remainder thereof;

and wherein each of said triple-tail cells of said second rectifier has different input voltage range from the remainder thereof.

10. A logarithmic amplifier circuit comprising:

(a) a differential amplifier producing an amplified output signal in response to an initial input signal;

(b) a first rectifier for rectifying said initial input signal and for generating a first rectified output signal;

(c) a second rectifier for rectifying said amplified output signal produced by said differential amplifier and for generating a second rectified output signal;

(d) an adder for adding said first rectified output signal and said second rectified output signal to produce an output signal having a logarithmic characteristic as an output of said logarithmic amplifier circuit;

(e) said first rectifier including a first differential pair of first and second MOSFETs whose sources are coupled together, a third MOSFET whose source is connected to said coupled sources, and a first current source connected with said sources of said first, second and third MOSFETs;

said first, second and third MOSFETs being driven by a first tail current produced by said first current source;

said initial input signal being applied across gates of said first and second MOSFETs, and a first dc voltage being applied to a gate of said third MOSFET;

said first and second MOSFETs having drains coupled together and a first output current being outputted through said coupled drains of said first and second MOSFETs;

a second output current being outputted through a drain of said third MOSFET;

one of said first output current, said second output current, and a differential current of said first and second output currents being used as said first rectified output signal; and (f) said second rectifier including a second differential pair of fourth and fifth MOSFETs whose sources are coupled together, a sixth MOSFET whose source is connected to said coupled sources, and a second current source connected with said coupled sources of said third, fourth and fifth MOSFETs;

said fourth, fifth and sixth MOSFETs being driven by a second tail current produced by said second current source;

said amplified output signal being applied across gates of said fourth and fifth MOSFETs, and a second dc voltage being applied to a gate of said sixth MOSFET;

said fourth and fifth MOSFETs having drains coupled together and a third output current being outputted through said coupled drains of said fourth and fifth MOSFETs;

a fourth output current being outputted through a drain of said sixth MOSFET;

one of said third output current, said fourth output current, and a differential current of said third and fourth output currents being used as said second rectified output signal.

11. A circuit as claimed in claim 10, wherein said first and second MOSFETs have ratios (W/L) equal to each other and said third MOSFET has a ratio (W/L) different from those of the first and second MOSFETs, where W is a gate width and L is a gate length;

and wherein said fourth and fifth MOSFETs have ratios (W/L) equal to each other and said sixth MOSFET has a ratio (W/L) different from those of said fourth and fifth MOSFETs.

12. A circuit as claimed in claim 10, wherein said first, second and third MOSFETs have ratios (W/L) equal to each other, and wherein said fourth, fifth and sixth MOSFETs have ratios (W/L) equal to each other.

13. A logarithmic amplifier circuit comprising:

(a) a differential amplifier producing an amplified output signal in response to an initial input signal;

(b) a first rectifier for rectifying said initial input signal and for generating a first rectified output signal, said first rectifier having triple-tail cells connected in parallel;

(c) a second rectifier for rectifying said output signal from said differential amplifier and for generating a second rectified output signal, said second rectifier having triple-tail cells connected in parallel;

(d) an adder for adding said first rectified output signal and said second rectified output signal to produce an output signal having a logarithmic characteristic;

(e) each of said triple-tail cells of said first rectifier including first, second and third MOSFETs whose sources are coupled together and a first current source connected with said coupled sources of said first, second and third MOSFETs;

said first, second and third MOSFETs being driven by a tail current produced by said first current source;

said initial input signal being applied across gates of said first and second MOSFETs of said triple-tail cells of said first rectifier, and a dc voltage being applied to gates of said third MOSFETs of said triple-tail cells of said first rectifier;

said first and second MOSFETs of said triple-tail cells of said first rectifier having drains coupled together and a first output current being outputted through said coupled drains;

a second output current being outputted through drains of said third MOSFETs of said triple-tail cells of said first rectifier;

one of said first output current, said second output current, and a differential current of said first and second output currents being used as said first rectified output signal; and (f) each of said triple-tail cells of said second rectifier including a second differential pair of fourth and fifth MOSFETs whose sources are coupled together, a sixth MOSFET whose source is connected to the coupled sources, and a second current source connected with said coupled sources of said third, fourth and fifth MOSFETs;

said fourth, fifth and sixth MOSFETs being driven by a tail current produced by said second current source;

said output signal from said differential amplifier being applied across gates of said fourth and fifth MOSFETs of said triple-tail cells of said second rectifier, and a dc voltage being applied to gates of said sixth MOSFETs of said second rectifier;

said fourth and fifth transistors having drains coupled together of said triple-tail cells of said second rectifier and a third output current being outputted through said coupled drains;

a fourth output current being outputted through drains of said sixth transistors of said triple-tail cells of said second rectifier;

one of said third output current, said fourth output current, and a differential current of said third and fourth output currents being used as said second rectified output signal.

14. A circuit as claimed in claim 13, wherein said first and second MOSFETs have ratios (W/L) equal to each other and said third MOSFET has a ratio (W/L) different from those of the first and second MOSFETs in each of said triple-tail cells of said first rectifier, where W is a gate width and L is a gate length of each of said first to sixth MOSFETs;

and wherein said fourth land fifth MOSFETs having ratios (W/L) equal to each other and said sixth MOSFET having a ratio (W/L) different from those of said fourth and fifth MOSFETs in each of said triple-tail cells of said second rectifier.

15. A circuit as claimed in claim 13, wherein said first, second and third MOSFETs have ratios (W/L) equal to each other in each of said triple-tail cells of said first rectifier, where W is a gate width and L is a gate length of each of said first to sixth MOSFETs;

and wherein said fourth, fifth and sixth MOSFETs have ratios (W/L) equal to each other in each of said triple-tail cells of said second rectifier.

16. A circuit as claimed in claim 13, wherein each of said triple-tail cells of said first rectifier has a different input voltage range from the remainder thereof;

and wherein each of said triple-tail cells of said second rectifier has a different input voltage range from the remainder thereof.

* * * * *

UNITED STATES PATENT AND TRADEMARK OFFICE
CERTIFICATE OF CORRECTION

PATENT NO. : 5,521,542
DATED : May 28, 1996
INVENTOR(S) : Katsuji KIMURA

It is certified that error appears in the above-indentified patent and that said Letters Patent is hereby corrected as shown below:

Column 4, line 56, delete "lo".

Figure 5:
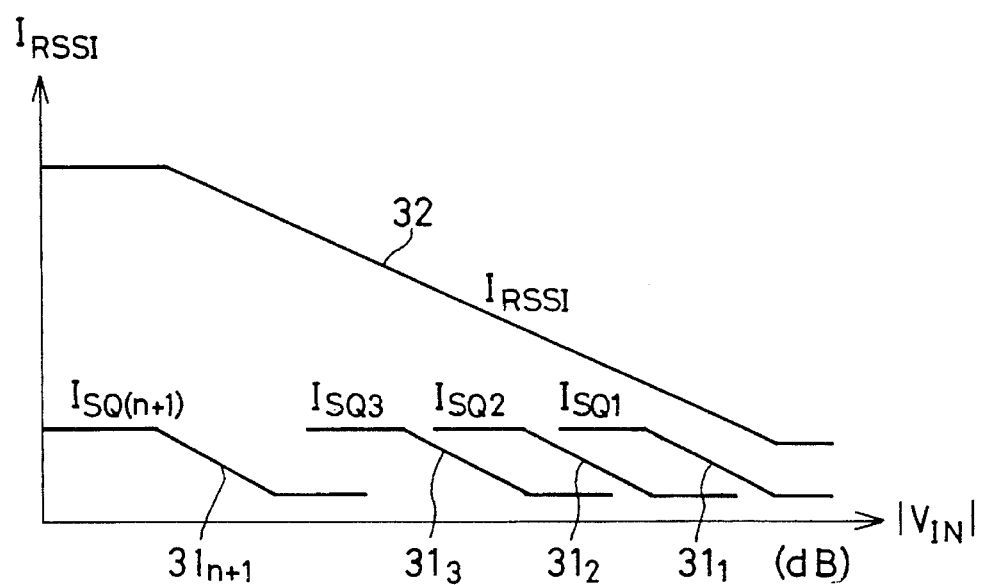
FIG. 5 shows characteristics of the rectified output currents from the full-wave rectifiers of FIG. 2 and input-output characteristics of the logarithmic amplifier circuit of FIG. 1.

Column 9, line 34, before "shows" insert --FIG. 5--.

Column 11, line 59, delete "firs: embodiment, one of :he" and insert therefor --first embodiment, one of the--.

Signed and Sealed this

Twenty-fourth Day of September, 1996

Attest:

BRUCE LEHMAN

Attesting Officer        Commissioner of Patents and Trademarks